(12) United States Patent
Tomotani

(10) Patent No.: US 6,628,536 B2
(45) Date of Patent: Sep. 30, 2003

(54) SEMICONDUCTOR MEMORY DEVICE

(75) Inventor: Hiroshi Tomotani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/076,426

(22) Filed: Feb. 19, 2002

(65) Prior Publication Data
US 2002/0113254 A1 Aug. 22, 2002

(30) Foreign Application Priority Data

Feb. 20, 2001 (JP) .......................... 2001-043794

(51) Int. Cl.[7] .................................. G11C 5/02
(52) U.S. Cl. .............................. 365/51; 365/52; 365/63; 365/230.03
(58) Field of Search ............................. 365/51, 52, 63, 365/230.03

(56) References Cited

U.S. PATENT DOCUMENTS

| 5,561,623 | A | * | 10/1996 | Ema | ............................ 365/51 |
| 5,903,022 | A | | 5/1999 | Takashima et al. | |
| 6,317,353 | B1 | * | 11/2001 | Ikeda et al. | .................... 365/63 |
| 6,351,413 | B1 | * | 2/2002 | Micheloni et al. | ...... 365/185.11 |

FOREIGN PATENT DOCUMENTS

| JP | 06318645 A | 11/1994 |
| JP | 10261771 A | 9/1998 |
| JP | 2000307075 A | 11/2000 |
| JP | 2000323672 A | 11/2000 |

* cited by examiner

*Primary Examiner*—Huan Hoang
(74) *Attorney, Agent, or Firm*—McDermott, Will & Emery

(57) ABSTRACT

A semiconductor memory device with a high-capacity memory cell array includes a plurality of global word lines per memory cell row of the memory cell array. The global word lines are formed in two wiring layers (upper and lower layers). This substantially reduces the number of memory cells connected per global word line without increasing the memory cell size, allowing for an improved operation speed of the memory cells and reduced power consumption.

9 Claims, 11 Drawing Sheets

SEMICONDUCTOR MEMORY DEVICE

BACKGROUND OF THE INVENTION

The present invention generally relates to the structure of a semiconductor memory device which enables a high operation speed even in a high-capacity semiconductor memory device.

FIG. 11 partially shows memory cell arrays of a conventional, typical semiconductor memory device. The semiconductor memory device of FIG. 11 includes memory cell arrays 1a to 1d, a local word line 10, bit line pairs (40a, 40b), (41a, 41b), (42a, 42b), (43a, 43b) and a global word line 20. Each memory cell array 1a to 1d includes a multiplicity of memory cells arranged in row and column directions. The local word line 10 is formed from a relatively high resistance material, and selects the memory cells arranged in the row direction in the memory cell arrays 1a to 1d. The bit line pair (40a, 40b), (41a, 41b), (42a, 42b), (43a, 43b) transmits the memory cell data to a sense amplifier in the subsequent stage. The global word line 20 is formed from a relatively low resistance material, and connected to the local word line 10 at intervals of an arbitrary number of memory cell arrays.

In the conventional structure, however, the number of memory cells in the row direction and thus the load capacity of the word line are increased in proportion to the capacity of the memory cell arrays 1a to 1d. Such increased load capacity hinders rapid activation of the word line, increasing access delay.

SUMMARY OF THE INVENTION

It is an object of the present invention to implement an improved operation speed even in a high-capacity semiconductor memory device.

In order to achieve the above object, the present invention uses a substantially reduced number of memory cells connected per global word line.

More specifically, a semiconductor memory device of the present invention includes: a memory cell array including a plurality of memory cells arranged in a matrix in row and column directions; a local word line for selecting memory cells in the row direction of the memory cell array; a bit line pair for transmitting data of memory cells in the column direction of the memory cell array; and a plurality of global word lines connected to the local word line, and formed in a wiring layer located higher than that of the local word line. The plurality of global word lines are formed in at least two different wiring layers.

Preferably, the plurality of global word lines are formed on the memory cells arranged in the row direction of the memory cell array.

Preferably, of the plurality of global word lines, a global word line formed in an upper layer is connected to the local word line at a prescribed junction, and a global word line formed in a lower layer extends toward inside or outside of the memory cell so as to bypass the junction between the global word line in the upper layer and the local word line.

Preferably, the global word line formed in the lower layer bypasses the junction in a memory cell that is located adjacent to a memory cell of the junction in the row direction.

Preferably, at least two local word lines are arranged in a same row. Of the plurality of global word lines, a global word line formed in an upper layer is connected to one of the two local word lines, and a global word line formed in a lower layer is connected to the other local word line.

Preferably, the memory cell array includes at least two memory cell array blocks in the column direction. The local word line is divided into at least two lines corresponding the respective memory cell array blocks. The plurality of global word lines are connected to at least one of the local word lines.

Preferably, of the plurality of global word lines, a global word line formed in an upper layer is connected to a local word line of one of the at least two memory cell array blocks located further from a word line driver.

Preferably, the above semiconductor memory device further includes a spare memory cell for replacing a defective memory cell. The spare memory cell is connected to at least one of the plurality of global word lines.

Preferably, the above semiconductor memory device further includes: a precharge transistor for precharging a potential on each bit line of the bit line pair to a prescribed value; and a plurality of precharge control lines for controlling the precharge transistor. The plurality of precharge control lines are formed in at least two different wiring layers.

According to the present invention, a plurality of global word lines are arranged in the row direction. This reduces the number of memory cells connected per global word line, enabling rapid activation of the word line. Moreover, the plurality of global word lines are formed in at least two different wiring layers. This reduces coupling capacity between the global word lines. As a result, the time constant of the word line is reduced, whereby rapid activation of the word line is achieved more effectively.

According to the present invention, the plurality of global word lines are formed on the memory cells of the memory cell array. As a result, a compact semiconductor device is implemented without increasing the size of the memory cell array.

According to the present invention, the plurality of global word lines are formed in a wiring layer located higher than that of the word line. If the plurality of global word lines are formed in two different wiring layers (e.g., upper and lower layers), the global word line formed in the lower layer would interfere with a through hole or the like at the junction between the global word line formed in the upper layer and the word line. In the present invention, however, the global word line formed in the lower layer extends toward the inside or outside of the memory cell so as to bypass the junction. Therefore, the global word lines can be arranged in the memory cell array without increasing the size of the memory cell array.

Moreover, according to the present invention, adjacent two global word lines formed in different wiring layers are connected to different local word lines. This reduces coupling capacity between the adjacent global word lines, allowing for reduced operation delay of the word line.

Moreover, according to the present invention, a global word line is connected to, e.g., a local word line of a single memory cell array block, and another global word line is connected to, e.g., the local word lines of all the memory cell array blocks. Accordingly, only a word line of a specific block can be accessed by selecting a global word line to be activated. This allows for reduced power consumption.

Moreover, according to the present invention, the local word line of the memory cell array block located further from the word line driver is connected to the global word line formed in the upper layer, i.e., the global word line extending straight without interfering with the global word line formed in the lower layer. This enables reduction in critical operation delay in the memory cell array block located further from the word line driver.

Moreover, according to the present invention, the spare memory cell is connected to at least one of the plurality of global word lines. This enables rapid access to the spare memory cell.

Moreover, according to the present invention, a plurality of precharge control lines are formed in at least two different layers. This reduces coupling capacity between the precharge control lines, and also enables rapid activation of the precharge control line. As a result, the precharge transistor can be driven rapidly, enabling an improved precharging speed.

DESCRIPTION OF THE PREFERRED EMBODIMENTS

Hereinafter, preferred embodiments of the present invention will be described in conjunction with the accompanying drawings.

First Embodiment

Figure 1:
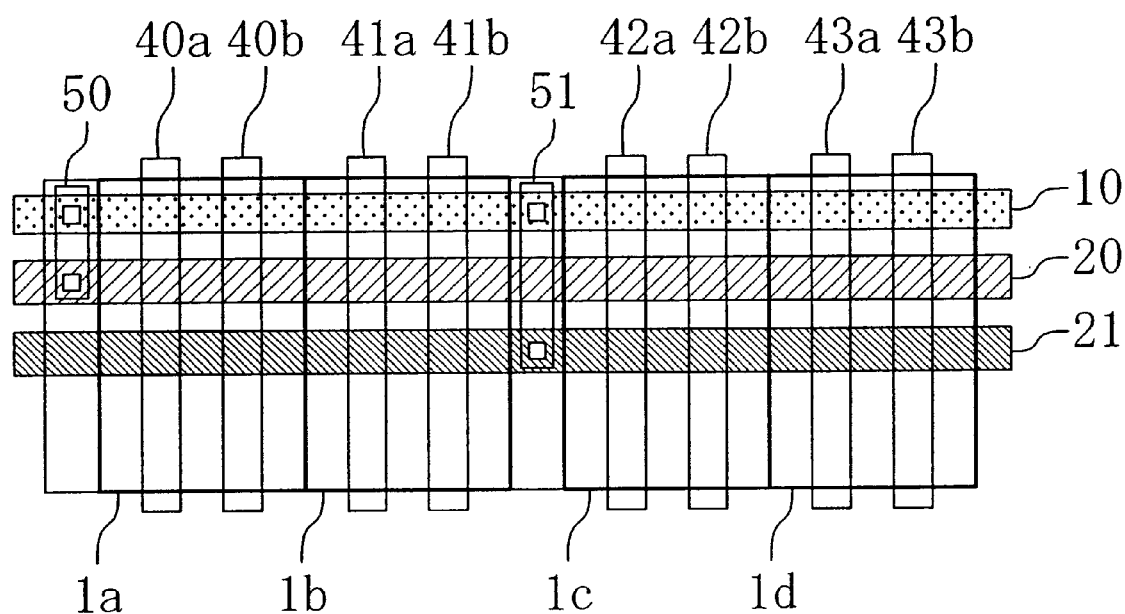
FIG. 1 shows the layout of a semiconductor memory device according to a first embodiment of the present invention.

FIG. 1 shows the memory cell layout of a semiconductor memory device according to the first embodiment of the present invention.

In the FIG. 1a, 1b, 1c and 1d denote a memory cell array, 10 denotes a local word line, and 20 and 21 denote a global word line. A single local word line 10 is provided per memory cell row. A plurality of (in the figure, two) global word lines 20, 21 are provided per local word line 10. One global word line 20 is formed in a first wiring layer located higher than the wiring layer of the local word line 10. The other global word line 21 is formed in a second wiring layer located higher than the first wiring layer. Hereinafter, the global word line 20 is referred to as lower global word line 20, and the global word line 21 is referred to as upper global word line 21. 40a, 40b, 41a, 41b, 42a, 42b, 43a and 42b denote a bit line. 50 and 51 denotes a lining cell. The lining cell 50 connects the lower global word line 20 with the local word line 10. The lining cell 51 connects the upper global word line 21 with the local word line 10.

As shown in FIG. 1, in the present embodiment, two global word lines 20, 21 are formed in different wiring layers in the row direction of the memory cell arrays 1a to 1d. This reduces the number of memory cells connected per global word line, and also reduces coupling capacity between the global word lines 20, 21. As a result, the time constant of the word lines is reduced, enabling an improved operation speed. Moreover, forming two global word lines 20, 21 in different wiring layers enables the two global word lines 20, 21 to be arranged in the limited space without increasing the size of the memory cell arrays 1a to 1d.

Figure 2:
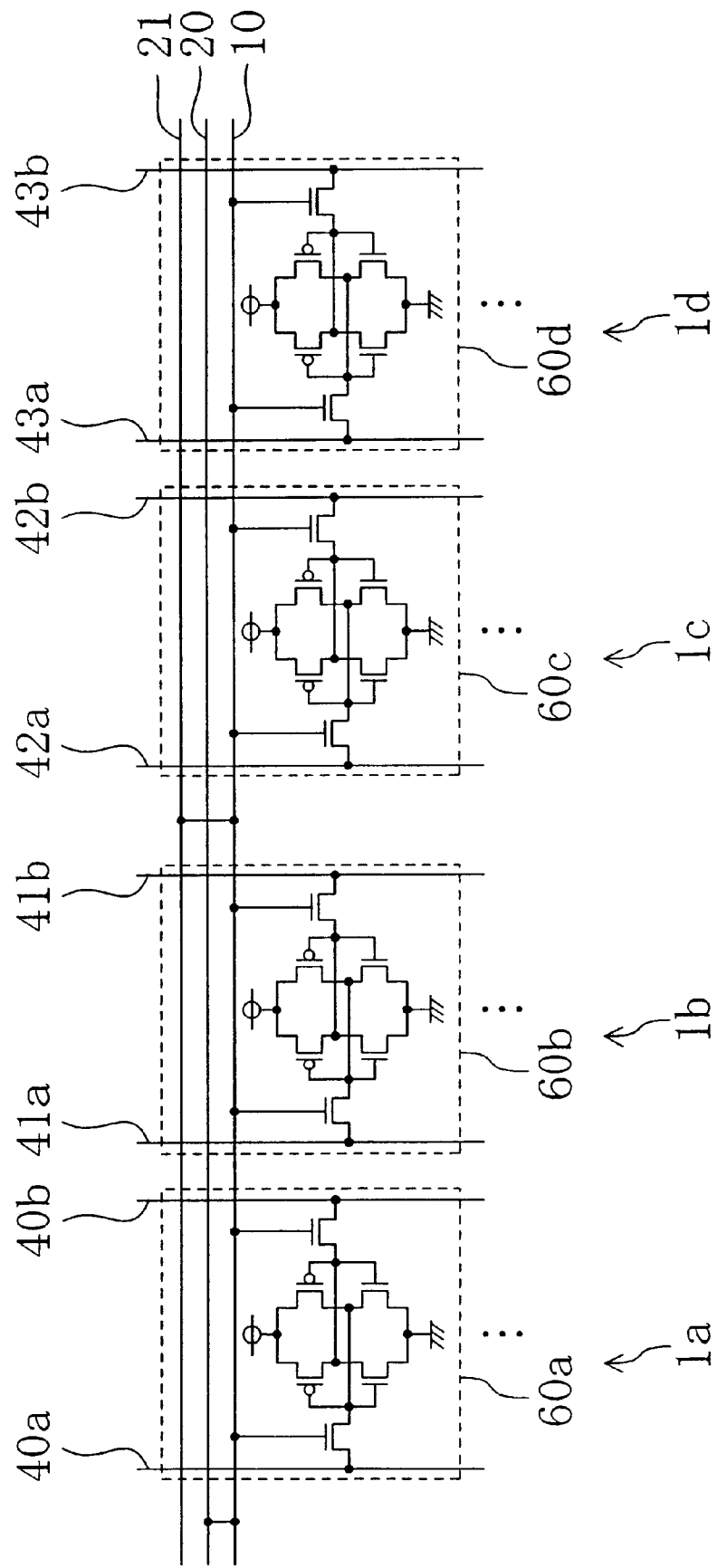
FIG. 2 is a circuit diagram showing in detail a memory cell portion of the semiconductor memory device of the first embodiment.

FIG. 2 is an exemplary circuit diagram of the semiconductor memory device of the present embodiment. FIG. 2 specifically shows the memory cell arrays 1a to 1d in the layout of FIG. 1. Each memory cell array 1a to 1d in FIG. 2 includes a plurality of memory cells 60a to 60d . . . .

In the present embodiment, two global word lines 20, 21 are formed in different wiring layers in the row direction of the memory cell arrays 1a to 1d, as described above. A word line of the memory cells 60a to 60d is accessed by selecting the global word lines 20, 21 and the local word line 10 connected thereto. Data is then read from or written to the memory cells 60a to 60d through the corresponding bit line pairs (40a, 40b), (41a, 41b), (42a, 42b), (43a, 43b).

Since two global word lines 20, 21 drive the local word line 10, the load (the number of memory cells) connected per global word line is reduced. As a result, the time constant of the word lines is reduced, enabling an improved operation speed of the memory cells 60a to 60d.

Figure 3:
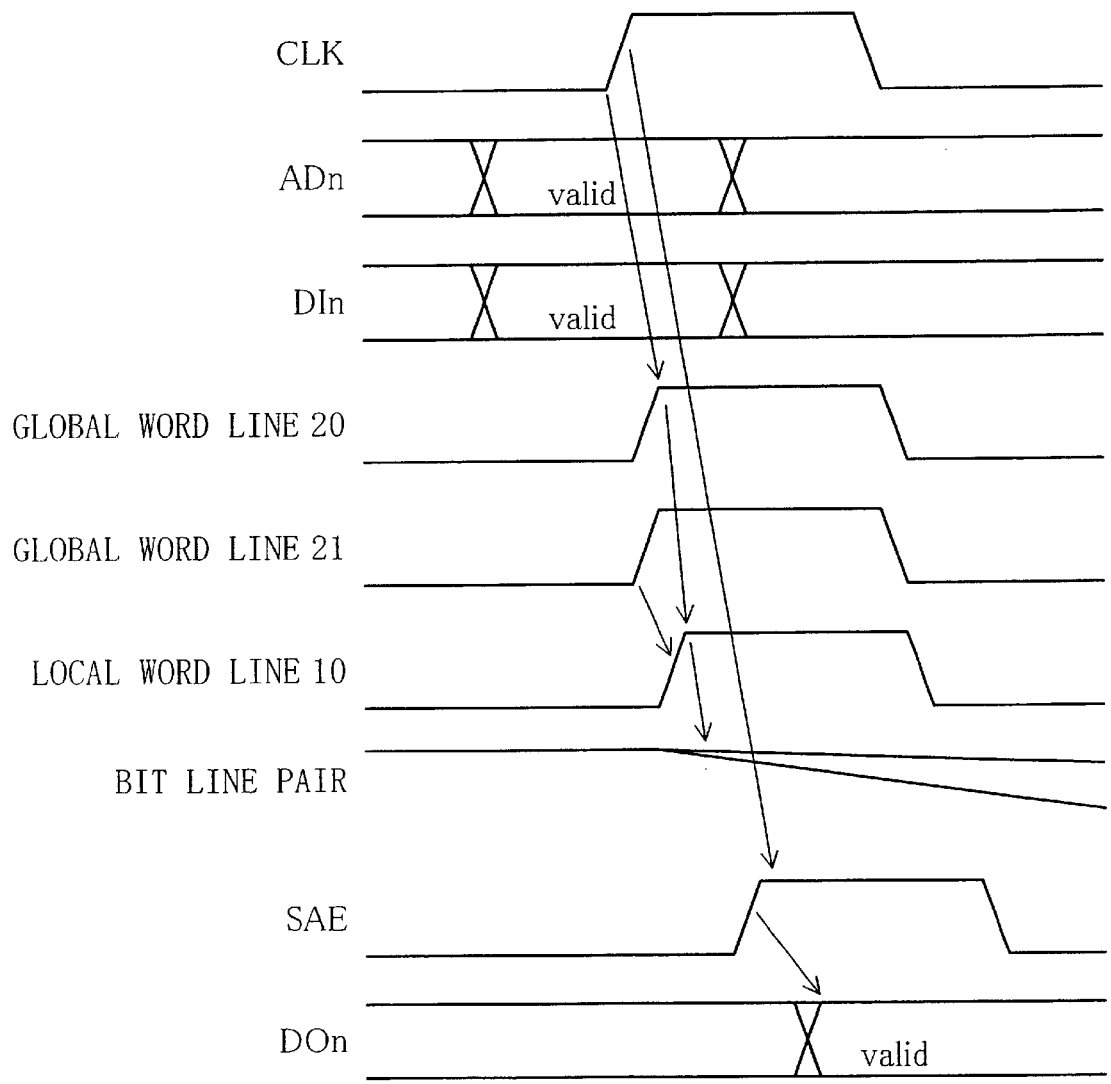
FIG. 3 is a waveform chart of the semiconductor memory device of the first embodiment.

FIG. 3 shows operation waveforms of the present embodiment. In FIG. 3, an address signal ADn and a data signal DIn are fetched in response to the rise of a clock signal CLK. According to the address signal ADn, specific global word lines 20, 21 are selected in synchronization with the clock signal CLK. The local word line 10 connected to the global word lines 20, 21 is also selected. Memory cell data is then output through the bit line pairs corresponding to the respective memory cells selected by the local word line 10.

Accordingly, in the present embodiment, the time constant of the global word lines 20, 21 is reduced. As a result, the delay time of the word lines is reduced, allowing for rapid access to the memory cells.

Second Embodiment

Hereinafter, the second embodiment of the present invention will be described with reference to FIG. 4.

Figure 4:
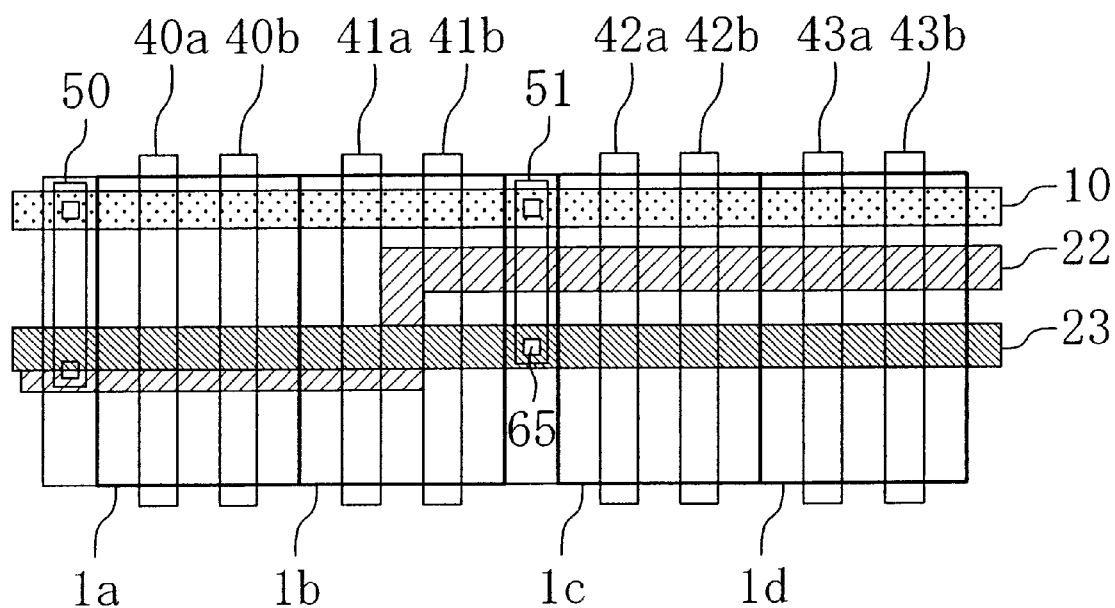
FIG. 4 shows the layout of a semiconductor memory device according to a second embodiment of the present invention.

FIG. 4 shows the layout of the semiconductor memory device of the present embodiment. In FIG. 4, two global word lines 22, 23 are formed above the memory cells of the memory cell arrays 1a to 1d in the row direction. This implements a compact semiconductor memory device as compared to the case where the global word lines 22, 23 are formed outside the memory cell arrays 1a to 1d.

The global word lines 22, 23 are formed in different wiring layers. More specifically, the global word line 22 is formed in the lower wiring layer, and the global word line 23 is formed in the upper wiring layer. Hereinafter, the global word line 22 is referred to as lower global word line 22, and the global word line 23 is referred to as upper global word line 23.

The upper global word line 23 extends straight in the row direction, and is connected to the local word line 10 via a through hole 65 in the lining cell 51. In the left portion of the figure, the lower global word line 22 extends in the row direction right under the upper global word line 23. The lower global word line 22 then bypasses the lining cell 51 (the junction between the upper global word line 23 and the local word line 10) and further extends in the row direction. In other words, the lower global word line 22 is bent toward the inside of the memory cell in the memory cell array 1b located on the left of the lining cell 51 in the figure. The lower global word line 22 then extends in the row direction between, and in parallel with, the local word line 10 and the upper global word line 23.

In the case where the lower global word line 22 is arranged right under the upper global word line 23, the lower global word line 22 would normally interfere with the junction 51 between the upper global word line 23 and the local word line 10. However, the structure of the present embodiment enables such global word lines 22, 23 to be arranged within the memory cell arrays 1a to 1d without causing such interference and without increasing the size of the memory cell arrays 1a to 1d.

Note that, in the present embodiment, the upper and lower global word lines 23, 22 are arranged above the memory cell arrays 1a to 1d. However, the upper and lower global word lines 23, 22 may alternatively be arranged outside the memory cell arrays 1a to 1d. It should be understood that, when the local word line 10 is arranged near the upper global word line 23, the lower global word line 22 may be bent toward the outside of the memory cell so as to bypass the lining cell 51, and then extend in the row direction along the side of the upper global word line 23 located further from the local word line 10.

Third Embodiment

Hereinafter, the third embodiment of the present invention will be described with reference to FIGS. 5 and 6.

Figure 5:
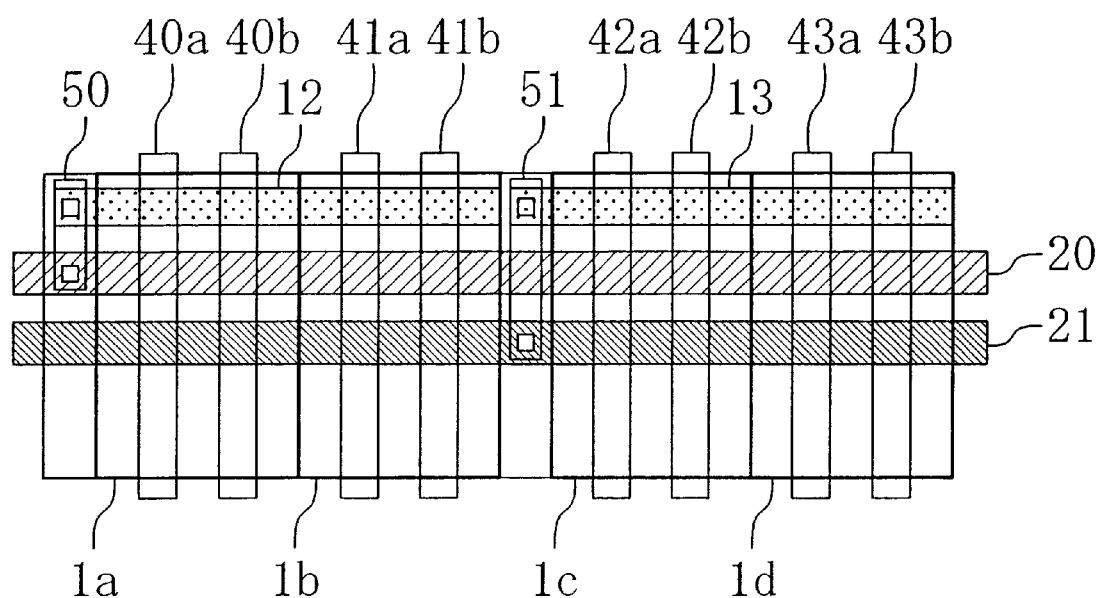
FIG. 5 shows the layout of a semiconductor memory device according to a third embodiment of the present invention.
Figure 6:
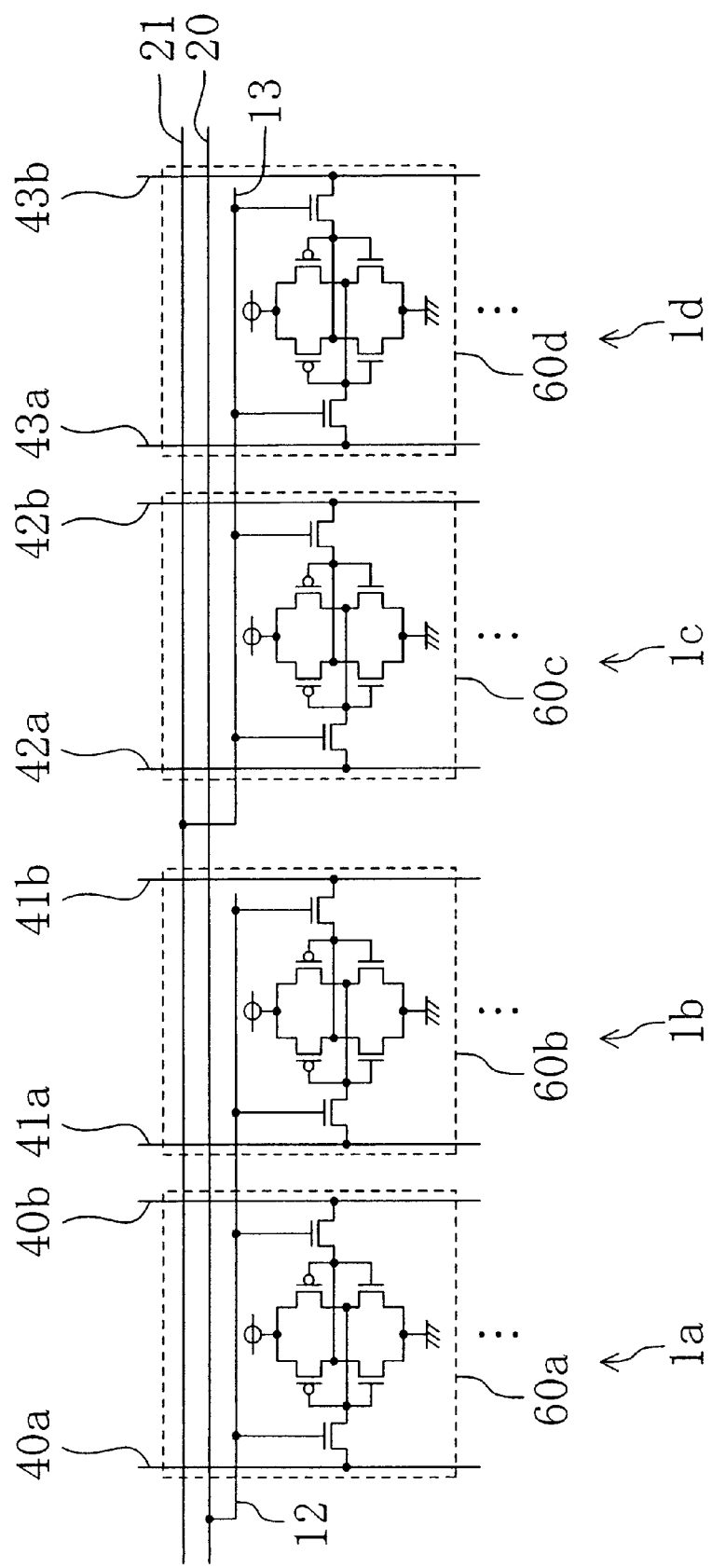
FIG. 6 is a circuit diagram showing in detail a memory cell portion of the semiconductor memory device of the third embodiment.

FIGS. 5 and 6 show the layout of the semiconductor memory device of the present embodiment. In these figures, two local word lines are arranged in the same row. One local word line 12 selects the memory cells 60a, 60b . . . of the memory cell arrays 1a, 1b, and the other local word line 13 selects the memory cells 60c, 60d . . . of the memory cell arrays 1c, 1d. Two adjacent global word lines 20, 21 extend in parallel with the local word lines 12, 13. The lower global word line 20 is connected to one local word line 12 through the lining cell 50, and the upper global word line 21 is connected to the other local word line 13 through the lining cell 51.

In the present embodiment, each global word line 20, 21 is connected to either the local word line 12 or 13. This reduces coupling capacity between adjacent two global word lines 20, 21, allowing for reduced operation delay of the global word lines 20, 21.

Fourth Embodiment

Hereinafter, the fourth embodiment of the present invention will be described with reference to FIG. 7.

Figure 7:
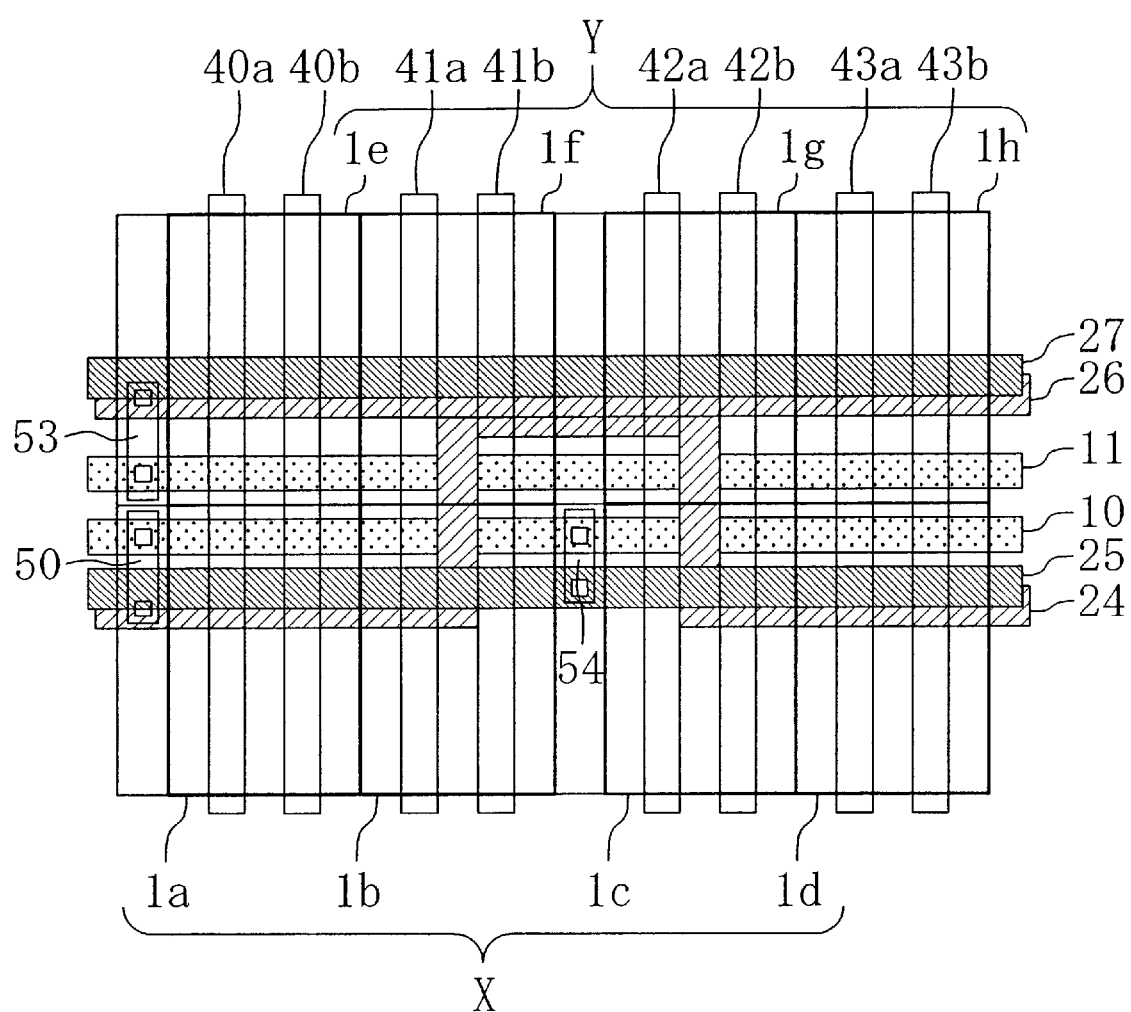
FIG. 7 shows the layout of a semiconductor memory device according to a fourth embodiment of the present invention.

FIG. 7 shows the layout of the semiconductor memory device of the present embodiment. In FIG. 7, a memory cell array block X includes four memory cell arrays 1a to 1d, and a memory cell array block Y includes four memory cell arrays 1e to 1h. The memory cell array block Y is located above the memory cell array block X in the column direction. Local word lines 10, 11 extending in the row direction correspond to the memory cell array blocks X, Y, respectively. These two local word lines 10, 11 are driven by a word line driver (not shown). Although not shown in the figure, the word line driver is provided at a prescribed position above the memory cell array block Y in the figure.

In FIG. 7, two global word lines 24, 25 corresponding to one memory cell array block X are formed in different wiring layers in the row direction. One global word line 24 is formed in the lower layer, and the other global word line 25 is formed in the upper layer. Similarly, two global word lines 26, 27 corresponding to the other memory cell array block Y are formed in different wiring layers in the row direction. One global word line 26 is formed in the lower layer, and the other global word line 27 is formed in the upper layer. Hereinafter, the global word lines 24, 26 formed in the lower layer are referred to as lower global word lines 24, 26, and the global word lines 25, 27 formed in the upper layer are referred to as upper global word lines 25, 27. In one memory cell array block X, the lower global word line 24 is connected to the local word line 10 in the block X thorough a lining cell 50. The lower global word line 24 extends toward the other memory cell array block Y and is connected to the lower global word line 26 in the block Y. The lower global word line 26 in the memory cell array block Y is connected to the local word line 11 in the block Y through a lining cell 53.

The upper global word line 25 of the memory cell array block X is connected to the local word line 10 in the block X through a lining cell 54. The upper global word line 27 of the other memory cell array block Y is connected to neither the local word line 10 nor 11 of the blocks X, Y.

In the present embodiment, the local word line 10 is connected to both upper and lower global word lines 25, 24 in the memory cell array block X. In the other memory cell a array block Y, the local word line 11 is connected to the lower global word line 26, and the respective lower global word lines 24, 26 of the blocks X, Y are connected to each other. Accordingly, the memory cells in both memory cell array blocks X, Y can be accessed by selecting either the lower global word line 24 or 26. The memory cells in one memory cell array block X can be accessed by selecting the upper global word line 25 of the block X. As a result, either one memory cell array block X or both memory cell array blocks X, Y can be selected as necessary depending on a selected global word line. This enables reduction in power consumption.

The memory cell array block located further from the word line driver, i.e., the memory cell array block X, has greater driving delay of the word line as compared to the memory cell array block Y located closer to the word line driver. However, the local word line 10 of the memory cell array block X is connected to the upper global word line 25 of the block X. The upper global word line 25 extends straight in the row direction, and therefore has a relatively small amount of delay. Accordingly, access delay to the memory cells in the block X can be minimized.

Fifth Embodiment

Hereinafter, the fifth embodiment of the present invention will be described with reference to FIGS. 8 and 9.

Figure 8:
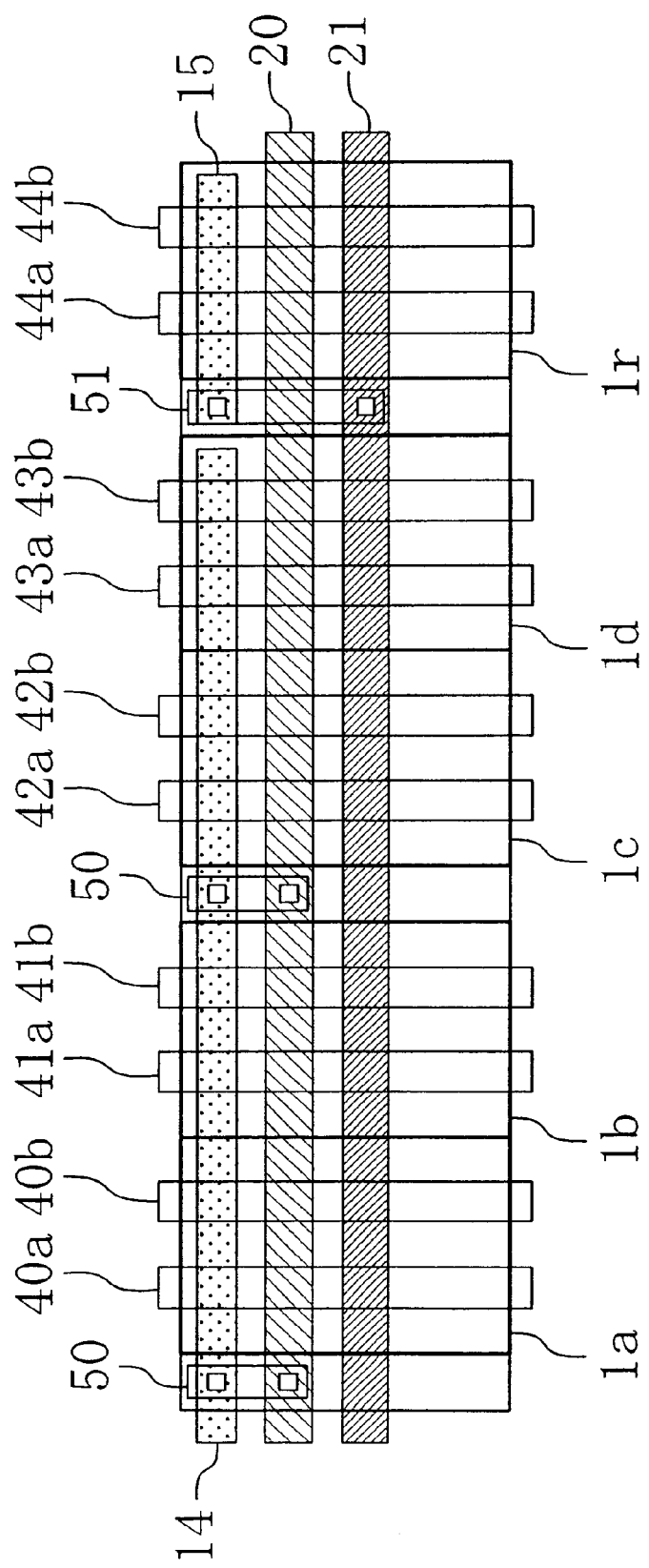
FIG. 8 shows the layout of a semiconductor memory device according to a fifth embodiment of the present invention.
Figure 9:
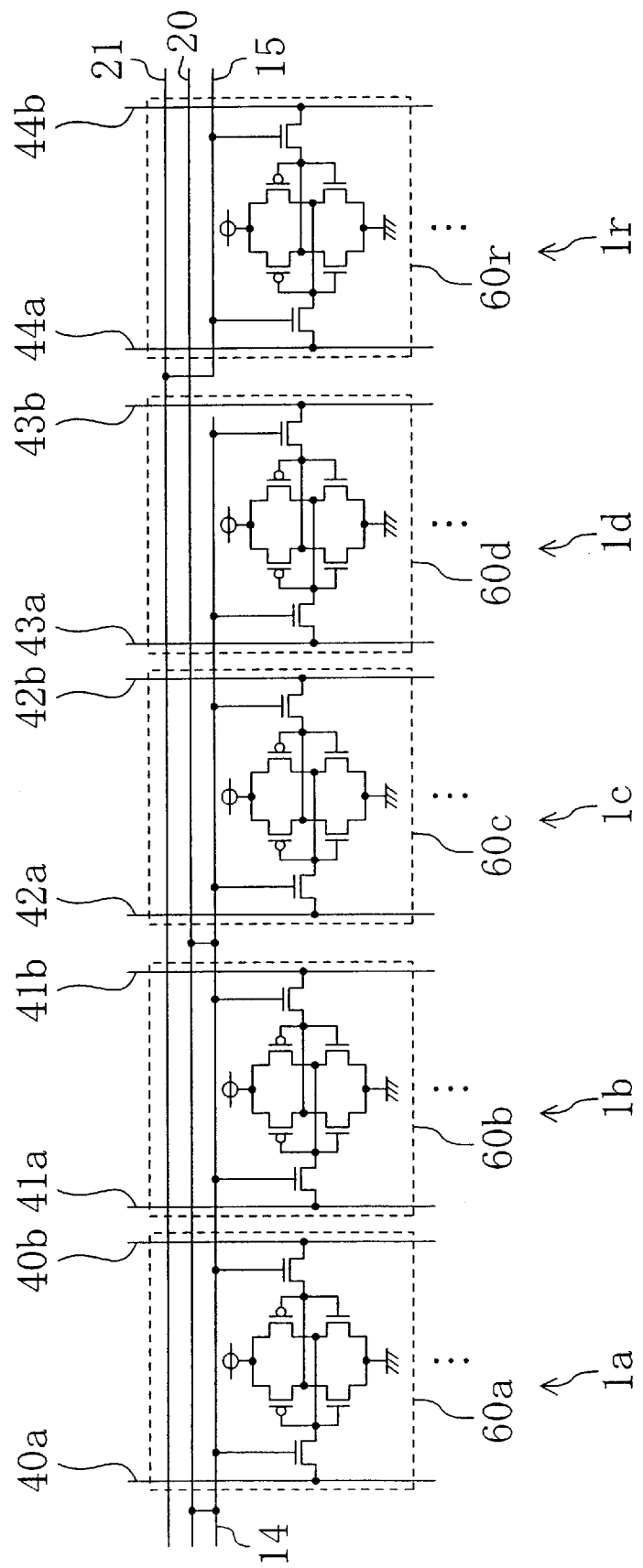
FIG. 9 is a circuit diagram showing in detail a memory cell portion of the semiconductor memory device of the fifth embodiment.

FIGS. 8 and 9 show the layout of the semiconductor memory device of the present embodiment. In FIGS. 8 and 9, a spare memory cell array 1r includes spare memory cells 60r If any of the memory cells 60a, 60b, 60c, 60d . . . in the regular memory cell arrays 1a to 1d is or becomes defective, data is read from or written to a spare memory cell 60r . . . instead of the defective memory cell.

A local word line 14 extends in the row direction in the upper portion of the regular memory cell arrays 1a to 1d. The lower global word line 20 extending in the row direction is connected to the local word line 14 through two lining cells 50. A local word line 15 extends in the row direction in the upper portion of the spare memory cell array 1r. The upper global word line 21 extending in parallel with the lower global word line 20 is connected to the local word line 15 through a lining cell 51.

In the present embodiment, the spare memory cells 60r in the spare memory cell array 1r are connected to one of the two global word lines 20, 21, i.e., the upper global word line 21, through the local word line 15. As described in the first embodiment, this reduces the number of memory cells connected per global word line. As a result, the local word line 15 is rapidly activated, allowing for rapid access to the spare memory cells 60r.

Sixth Embodiment

Hereinafter, the sixth embodiment of the present invention will be described with reference to FIG. 10.

Figure 10:
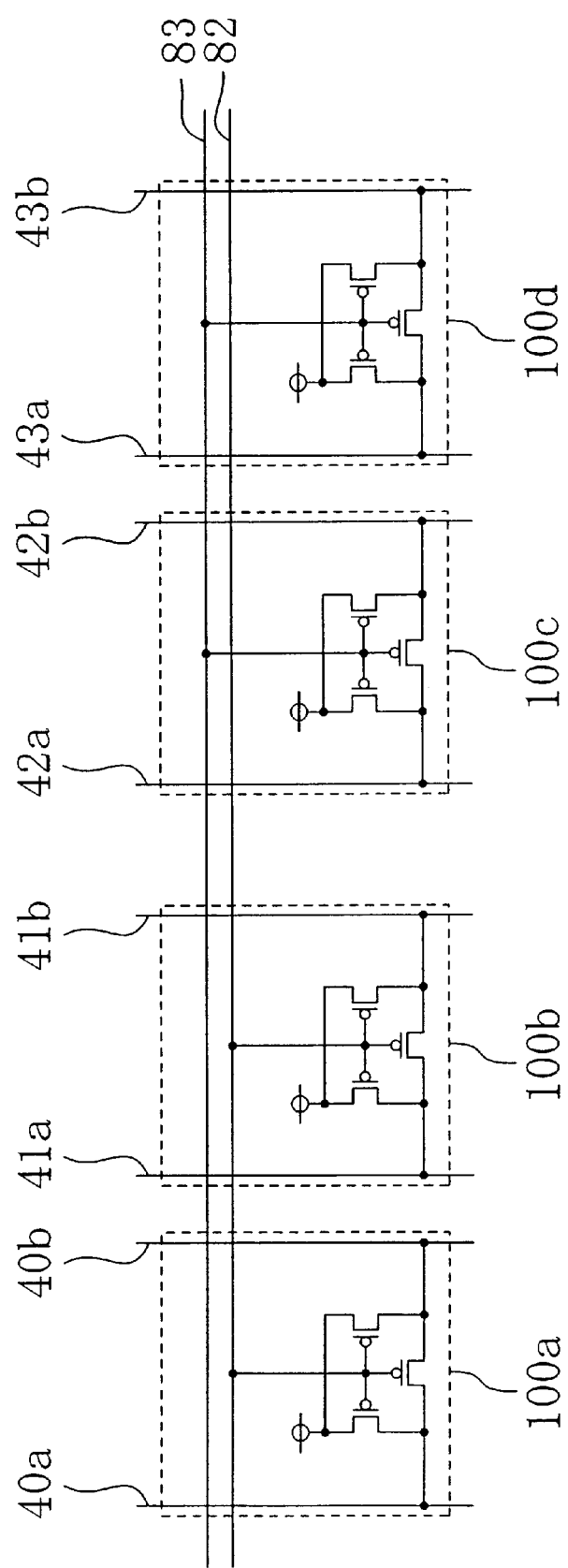
FIG. 10 is a circuit diagram of a precharge circuit portion of a semiconductor memory device according to a sixth embodiment of the present invention.
Figure 11:
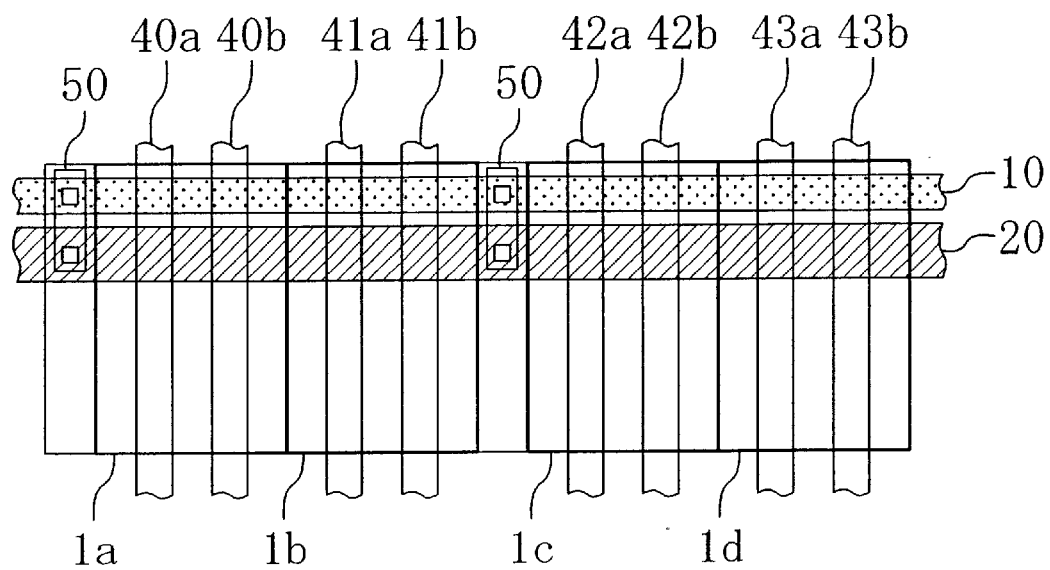
FIG. 11 shows the memory cell layout of a conventional semiconductor memory device.

FIG. 10 shows the layout of the semiconductor memory device of the present embodiment. FIG. 10 shows the structure of precharge transistors arranged above or below the memory cell arrays 1a to 1d in FIG. 1. In FIG. 10, each precharge transistor 100a to 100d precharges the bit lines 40a, 40b, 41a, 41b, 42a, 42b, 43a, 43b of the corresponding bit line pair in the corresponding memory cell array 1a to 1d to a prescribed voltage (e.g., half a power supply voltage). Above the precharge transistors 100a to 100d, two precharge control lines 82, 83 extend in parallel with each other in the row direction. The precharge control lines 82, 83 turn ON/OFF the precharge transistors 100a to 100d. The precharge control lines 82, 83 are formed in different wiring layers. For example, one precharge control line 82 is formed in the upper wiring layer, and the other precharge control line 83 is formed in the lower wiring layer.

Since two precharge control lines 82, 83 are provided in the present embodiment, the number of precharge transistors per precharge control line is reduced. As a result, the precharge transistors 100a to 100d are driven rapidly. Moreover, since the precharge control lines 82, 83 are formed in different wiring layers, coupling capacity between the precharge control lines 82, 83 is reduced. As a result, the precharge control line 82, 83 are activated rapidly. Accordingly, the precharge transistors 100a to 100d can be driven more rapidly, allowing for an improved precharging speed.

Note that two global word lines are provided in each of the first to fifth embodiments. However, it should be appreciated that the present invention is not limited to this, and three or more global word lines may be provided. Similarly, regarding the precharge control lines 82, 83 described in the sixth embodiment, three or more precharge control lines may be provided.

What is claimed is:

1. A semiconductor memory device, comprising:
 a memory cell array including a plurality of memory cells arranged in a matrix in row and column directions;
 a local word line for selecting memory cells in the row direction of the memory cell array;
 a bit line pair for transmitting data of memory cells in the column direction of the memory cell array; and
 a plurality of global word lines connected to the local word line, and formed in a wiring layer located higher than that of the local word line, wherein
 the plurality of global word lines are formed in at least two different wiring layers.

2. The semiconductor memory device according to claim 1, wherein the plurality of global word lines are formed on the memory cells arranged in the row direction of the memory cell array.

3. The semiconductor memory device according to claim 2, wherein, of the plurality of global word lines, a global word line formed in an upper layer is connected to the local word line at a prescribed junction, and a global word line formed in a lower layer extends toward inside or outside of the memory cell so as to bypass the junction between the global word line in the upper layer and the local word line.

4. The semiconductor memory device according to claim 3, wherein the global word line formed in the lower layer bypasses the junction in a memory cell that is located adjacent to a memory cell of the junction in the row direction.

5. The semiconductor memory device according to claim 1, wherein
 at least two local word lines are arranged in a same row, and
 of the plurality of global word lines, a global word line formed in an upper layer is connected to one of the two local word lines, and a global word line formed in a lower layer is connected to the other local word line.

6. The semiconductor memory device according to claim 1, wherein the memory cell array includes at least two memory cell array blocks in the column direction, the local word line is divided into at least two lines corresponding the respective memory cell array blocks, and the plurality of global word lines are connected to at least one of the local word lines.

7. The semiconductor memory device according to claim 6, wherein, of the plurality of global word lines, a global word line formed in an upper layer is connected to a local word line of one of the at least two memory cell array blocks located further from a word line driver.

8. The semiconductor memory device according to claim 1, further comprising a spare memory cell for replacing a defective memory cell, the spare memory cell being connected to at least one of the plurality of global word lines.

9. The semiconductor memory device according to claim 1, further comprising:
 a precharge transistor for precharging a potential on each bit line of the bit line pair to a prescribed value; and
 a plurality of precharge control lines for controlling the precharge transistor, wherein
 the plurality of precharge control lines are formed in at least two different wiring layers.

* * * * *